(12) United States Patent
Yamada et al.

(10) Patent No.: US 9,355,822 B2
(45) Date of Patent: May 31, 2016

(54) PLASMA PROCESSING APPARATUS

(71) Applicants: Tokyo Electron Limited, Minato-ku (JP); Daihen Corporation, Osaka-shi, Osaka (JP)

(72) Inventors: Norikazu Yamada, Miyagi (JP); Toshifumi Tachikawa, Miyagi (JP); Koichi Nagami, Miyagi (JP); Tatsuya Ikenari, Osaka (JP); Daisuke Maehara, Osaka (JP)

(73) Assignees: TOKYO ELECTRON LIMITED, Tokyo (JP); DAIHEN CORPORATION, Osaka (JP)

( * ) Notice: Subject to any disclaimer, the term of this patent is extended or adjusted under 35 U.S.C. 154(b) by 62 days.

(21) Appl. No.: 14/368,865

(22) PCT Filed: Dec. 13, 2012

(86) PCT No.: PCT/JP2012/007975
§ 371 (c)(1),
(2) Date: Jun. 26, 2014

(87) PCT Pub. No.: WO2013/099133
PCT Pub. Date: Jul. 4, 2013

(65) Prior Publication Data
US 2014/0361690 A1    Dec. 11, 2014

Related U.S. Application Data

(60) Provisional application No. 61/585,734, filed on Jan. 12, 2012.

(30) Foreign Application Priority Data

Dec. 27, 2011    (JP) ................ 2011-286024

(51) Int. Cl.
*H01J 7/24*    (2006.01)
*H01J 37/32*    (2006.01)
(Continued)

(52) U.S. Cl.
CPC ....... *H01J 37/32155* (2013.01); *C23C 16/5096* (2013.01); *C23C 16/515* (2013.01);
(Continued)

(58) Field of Classification Search
None
See application file for complete search history.

(56) References Cited

U.S. PATENT DOCUMENTS

| | | | |
|---|---|---|---|
| 6,059,935 A * | 5/2000 | Spence | H01J 37/32 204/156 |
| 6,242,360 B1 * | 6/2001 | Fischer | H01J 37/32082 156/345.44 |

(Continued)

FOREIGN PATENT DOCUMENTS

| | | |
|---|---|---|
| CN | 101552187 A | 10/2009 |
| JP | 2009-033080 A | 2/2009 |

(Continued)

OTHER PUBLICATIONS

International Search Report for PCT/JP2012/007975 dated Feb. 5, 2013.

*Primary Examiner* — Douglas W Owens
*Assistant Examiner* — Srinivas Sathiraju
(74) *Attorney, Agent, or Firm* — Pearne & Gordon LLP

(57) ABSTRACT

In a capacitively coupled plasma processing apparatus, a susceptor (lower electrode) 16 within a decompression chamber 10 faces an upper electrode 46 serving as a shower head. The susceptor 16 is electrically connected with a first high frequency power supply 36 and a second high frequency power supply 38 via matching devices 40 and 42, respectively. The first high frequency power supply 36 is formed of a linear amplifier type high frequency power supply and outputs a first high frequency power RF1 for plasma generation. The second high frequency power supply 38 is formed of a switching type high frequency power supply and outputs a second high frequency power RF2 for ion attraction. A residual high frequency power removing unit 74 is connected to a high frequency power supply line 45 on a side of the second high frequency power supply 38.

7 Claims, 9 Drawing Sheets

(51) Int. Cl.
  *C23C 16/515* (2006.01)
  *C23C 16/509* (2006.01)
  *H05H 1/46* (2006.01)

(52) U.S. Cl.
  CPC ..... *H01J 37/32091* (2013.01); *H01J 37/32165* (2013.01); *H01J 37/32174* (2013.01); *H01J 37/32183* (2013.01); *H05H 2001/4682* (2013.01)

(56) References Cited

U.S. PATENT DOCUMENTS

| | | | | |
|---|---|---|---|---|
| 6,506,685 | B2* | 1/2003 | Li | H01J 37/32165 118/723 E |
| 7,722,778 | B2* | 5/2010 | Fischer | H01J 37/304 118/702 |
| 7,837,825 | B2* | 11/2010 | Fischer | H01J 37/32623 118/723 E |
| 8,057,600 | B2* | 11/2011 | Nishimoto | H01J 37/32623 118/715 |
| 8,659,335 | B2* | 2/2014 | Nagarkatti | H03F 3/189 315/111.21 |
| 9,111,728 | B2* | 8/2015 | Holland | H01J 37/32357 |
| 2004/0154540 | A1* | 8/2004 | Hayami | H01J 37/32174 118/723 E |
| 2005/0093459 | A1* | 5/2005 | Kishinevsky | H01J 37/32082 315/111.21 |
| 2006/0066248 | A1* | 3/2006 | Chistyakov | H01J 37/32082 315/111.21 |
| 2008/0179948 | A1* | 7/2008 | Nagarkatti | H01J 37/32082 307/18 |
| 2009/0255800 | A1* | 10/2009 | Koshimizu | H01J 37/32165 204/164 |
| 2011/0121735 | A1* | 5/2011 | Penny | A61B 18/042 315/111.21 |
| 2012/0262064 | A1* | 10/2012 | Nagarkatti | H01J 37/32082 315/111.21 |
| 2012/0318456 | A1* | 12/2012 | Brouk | H01J 37/32009 156/345.28 |
| 2013/0175927 | A1* | 7/2013 | Lee | H05H 1/24 315/110 |

FOREIGN PATENT DOCUMENTS

| | | |
|---|---|---|
| JP | 2009-071292 A | 4/2009 |
| JP | 2009-246091 A | 10/2009 |
| JP | 2010-219491 A | 9/2010 |

* cited by examiner

EXPERIMENTAL EXAMPLE

COMPARATIVE EXAMPLE

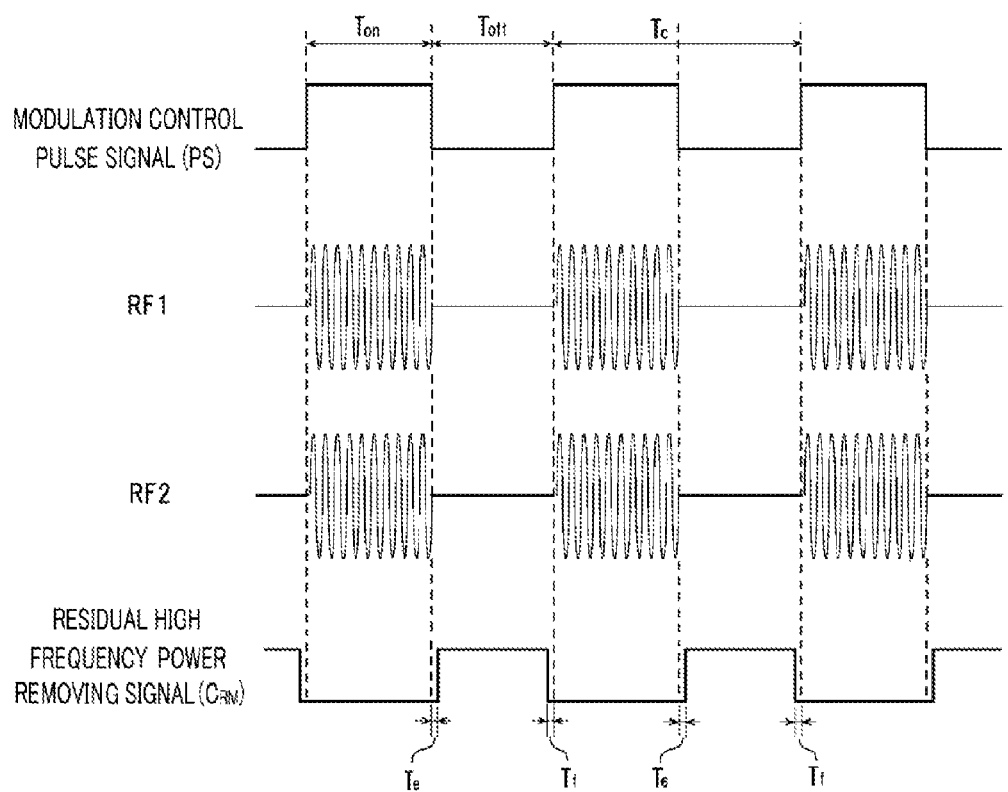

ABSTRACT# PLASMA PROCESSING APPARATUS

CROSS-REFERENCE TO RELATED APPLICATION

This Application is a U.S. national phase application under 35 U.S.C. §371 of PCT Application No. PCT/JP2012/007975 filed on Dec. 13, 2012, which claims the benefit of Japanese Patent Application No. 2011-286024 filed on Dec. 27, 2011, and U.S. Provisional Application Ser. No. 61/585,734 filed on Jan. 12, 2012, the entire disclosures of which are incorporated herein by reference.

TECHNICAL FIELD

The embodiments described herein pertain generally to a technology of performing a plasma process on a processing target substrate, and more particularly, pertain to a capacitively coupled plasma processing apparatus in which a high frequency power for plasma generation is modulated in a pulse shape.

BACKGROUND

A capacitively coupled plasma processing apparatus includes an upper electrode and a lower electrode arranged in parallel to each other within a processing vessel. A processing target substrate (e.g., a semiconductor wafer, a glass substrate, etc) is mounted on the lower electrode, and a high frequency power having a frequency (typically, about 13.56 MHz or higher) suitable for plasma generation is applied to the upper electrode or the lower electrode. Electrons are accelerated by a high frequency field generated between the two facing electrodes by applying the high frequency power, and plasma is generated as a result of ionization by collision between the electrons and a processing gas. Through a gas phase reaction or a surface reaction of radicals or ions included in the plasma, a thin film is formed on the substrate, or a material or a thin film on a surface of the substrate is etched.

Recently, as a design rule is getting more miniaturized in a manufacturing process of a semiconductor device or the like, higher level of dimensional accuracy is required in, especially, plasma etching. Further, it is required to increase etching selectivity against a mask or an underlying film and to improve etching uniformity in the entire surface of a substrate. For this reason, pressure and ion energy in a processing region within a chamber tends to be reduced, and a high frequency power having a high frequency equal to or higher than about 40 MHz is used.

However, as the pressure and the ion energy are reduced, an influence of a charging damage, which has been negligible conventionally, can be no more neglected. That is, in a conventional plasma processing apparatus having high ion energy, no serious problem may occur even when a plasma potential is non-uniform in the entire surface of the substrate. However, if the ion energy is lowered at a lower pressure, the non-uniformity of the plasma potential in the entire surface of the substrate may easily cause the charging damage on a gate oxide film.

To solve the problem, a power modulation process of modulating a high frequency power for plasma generation in an on/off pulse shape is considered to be effective (Patent Document 1). According to this power modulation process, a plasma generation state in which plasma of a processing gas is being generated and a plasma non-generation state in which plasma is not being generated are alternately repeated at a preset cycle during a plasma etching process. Accordingly, as compared to a typical plasma process in which plasma is continuously generated from the beginning of the process to the end thereof, a time period during which plasma is continuously generated may be shortened. Accordingly, the amount of electric charges introduced into a processing target substrate from the plasma at one time or the amount of electric charges accumulated on the surface of the processing target substrate may be reduced, so that the charging damage is suppressed from being generated. Therefore, a stable plasma process can be performed and reliability of the plasma process can be improved.

Further, in the capacitively coupled plasma processing apparatus, a RF bias method is widely employed. In this RF bias method, a high frequency power having a relatively low frequency (typically, about 13.56 MHz or lower) is applied to the lower electrode on which the substrate is mounted, and ions in the plasma are accelerated and attracted to the substrate by a negative bias voltage or a sheath voltage generated on the lower electrode. In this way, by accelerating the ions in the plasma and bringing them into collision with the surface of the substrate, a surface reaction, anisotropic etching or modification of a film may be facilitated.

However, when performing the etching process to form via holes or contact holes by using the capacitively coupled plasma etching apparatus, a so-called micro-loading effect may occur. That is, an etching rate may differ depending on the hole size, so that it is difficult to control an etching depth. Especially, the etching rate tends to be higher at a large area such as a guide ring (GR), whereas the etching rate tends to be lower at a small via in which CF-based radicals are difficult to be introduced.

To solve this problem, a power modulation process of modulating a high frequency power for ion attraction in an on/off pulse shape (Patent Document 2). According to this power modulation process, a period of maintaining a high power of the first level (on level) suitable for etching a preset film on the processing target substrate and a period of maintaining a low power of the second level (off level) as a high frequency power for ion attraction suitable for depositing polymer on a preset film on the processing target substrate are alternately repeated at a certain cycle. Accordingly, an adequate polymer layer can be in a state of being deposited on a certain film, so that it is possible to suppress etching from being progressed. Thus, an undesirable micro-loading effect may be reduced, and it may be possible to perform an etching process with a high selectivity and a high etching rate.

Further, in the capacitively coupled plasma etching apparatus, an organic mask having a low etching resistance, such as ArF photoresist, may be modified by applying a negative DC voltage to the upper electrode facing the substrate with a plasma generation space therebetween and attracting secondary electrons generated in the upper electrode into a surface layer of the substrate at a high speed. Recently, in order to improve the effect of modifying the organic mask by the high-speed electrons, there has been proposed a method of turning on and off a high frequency power for plasma generation and ion attraction with a regular pulse frequency and, synchronously, applying a DC voltage only during a period when the high frequency power is off (see, for example, Patent Document 3). As in this method, by applying the DC voltage to the upper electrode during a period when the high frequency power is turned off and, thus, a plasma sheath is thinned, the secondary electrons from the upper electrode may reach the substrate efficiently, so that the organic film on the substrate can be enhanced.

REFERENCES

Patent Document 1: Japanese Patent Laid-open Publication No. 2009-071292
Patent Document 2: Japanese Patent Laid-open Publication No. 2009-033080
Patent Document 3: Japanese Patent Laid-open Publication No. 2010-219491

DISCLOSURE OF THE INVENTION

Problems to be Solved by the Invention

In the conventional capacitively coupled plasma processing apparatus having the power modulation function as described above, when a high frequency power is switched from an on state to an off state in each cycle of a pulse frequency, a RF power is not removed immediately from a high frequency power supply line in a moment, but may be gradually decreased during a certain time period to be a zero level (L level). Such a RF power trailing phenomenon does not meet an original standard of the power modulation. As a result, an effect of the power modulation cannot be sufficiently achieved and accuracy of a RF power monitor provided on a high frequency power supply line or within a high frequency power supply can be negatively affected. In this regard, the present inventors have found that only when the power modulation is applied to a switching type high frequency power supply, the above-described RF power trailing phenomenon occurs.

In view of the foregoing, example embodiments provide a plasma processing apparatus capable of simply and securely suppressing the RF power trailing phenomenon from occurring on the high frequency power supply line when the power modulation is applied to the switching type high frequency power supply.

Means for Solving the Problems

In one example embodiment, a plasma processing apparatus generates plasma of a processing gas in an evacuable processing chamber that accommodates a substrate to be processed, which is loaded thereinto and unloaded therefrom, and performs a process on the substrate under the plasma. Further, the plasma processing apparatus includes a switching type high frequency power supply, having a DC power supply and a switching device, configured to convert a DC power outputted from the DC power supply into a high frequency power by turning on/off the switching device with a switching pulse at a high frequency; a high frequency power supply line through which the high frequency power outputted from the high frequency power supply is applied to the plasma; a matching device configured to match impedance on a side of the high frequency power supply with load impedance on the high frequency power supply line; a high frequency power modulation unit that controls the high frequency power supply to alternately repeat an on-period time where the high frequency power is in an on state and an off-period time where the high frequency power is in an off state at a preset pulse frequency; and a residual high frequency power removing unit configured to remove the high frequency power remaining on the high frequency power supply line during the off-period time in each cycle of the pulse frequency.

Effect of the Invention

In accordance with the example embodiments, since a plasma processing apparatus has a configuration described above, it is possible to simply and securely suppress a RF power trailing phenomenon from occurring on a high frequency power supply line when the power modulation is performed on a switching type high frequency power supply.

BRIEF DESCRIPTION OF THE DRAWINGS

FIG. 13 a diagram showing waveforms of respective components when the power modulation is simultaneously performed on the first high frequency power and the second high frequency power in the plasma processing apparatus.

MODE FOR CARRYING OUT THE INVENTION

Figure 1:
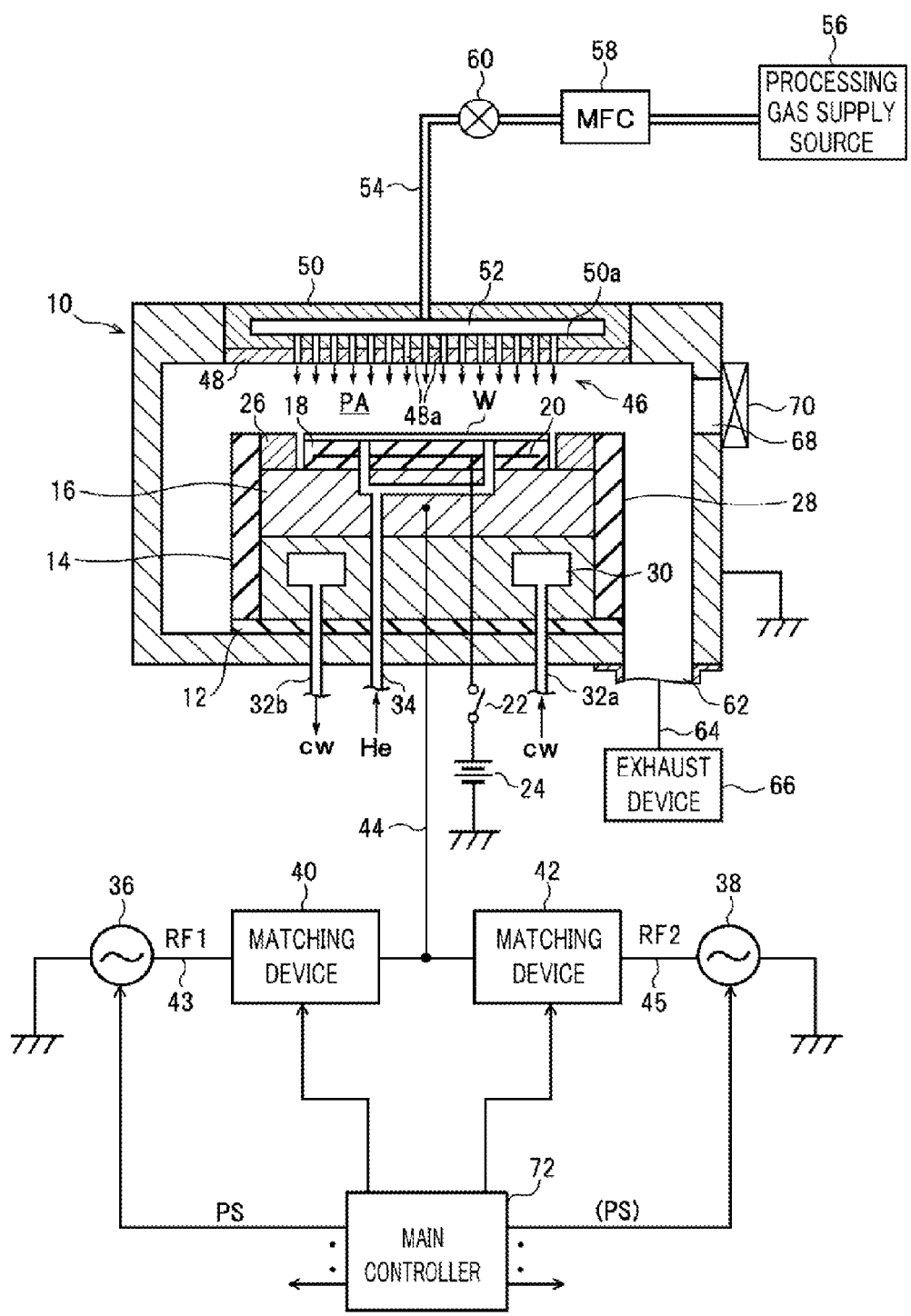
FIG. 1 is a cross-sectional view showing a configuration of a plasma processing apparatus in accordance with a first example embodiment.

In the following, example embodiments will be described, and reference is made to the accompanying drawings, which form a part of the description.
<Configuration of Plasma Processing Apparatus>
FIG. 1 is a diagram illustrating a configuration of a plasma processing apparatus in accordance with an example embodiment. The plasma processing apparatus is configured as a capacitively coupled (parallel plate type) plasma etching apparatus. By way of example, the plasma processing apparatus includes a cylindrical decompression chamber (processing vessel) 10 made of, but not limited to, aluminum having an alumite-treated (anodically oxidized) surface. The chamber 10 is grounded.

A circular columnar susceptor supporting member 14 is provided on an insulating plate 12 such as ceramic on a bottom of the chamber 10, and a susceptor 16 made of, but not limited to, aluminum is provided on the susceptor supporting member 14. The susceptor 16 serves as a lower electrode, and a processing target substrate, e.g., a semiconductor wafer W is mounted on the susceptor 16.

An electrostatic chuck 18 configured to hold the semiconductor wafer W is provided on a top surface of the susceptor 16. The electrostatic chuck 18 includes a pair of insulating layers or insulating sheets; and an electrode 20 embedded therebetween. The electrode 20 is made of a conductive film and is electrically connected with a DC power supply 24 via a switch 22. The semiconductor wafer W can be held on the electrostatic chuck 18 by an electrostatic adsorptive force generated by a DC voltage applied from the DC power supply 24. In order to improve etching uniformity, a focus ring 26 made of, but not limited to, silicon is provided on the top surface of the susceptor 16 to surround the electrostatic chuck 18. A cylindrical inner wall member 28 made of, but not limited to, quartz is attached to side surfaces of the susceptor 16 and the susceptor supporting member 14.

A coolant path 30 extended in, e.g., a circumferential direction is provided within the susceptor supporting member 14. A coolant of a preset temperature, e.g., cooling water from an external chiller unit (not shown) is supplied into and circulated through the coolant path 30 via pipelines 32a and 32b. A processing temperature of the semiconductor wafer W on the susceptor 16 can be controlled by adjusting the temperature of the coolant. Further, a heat transfer gas, e.g., a He gas from a heat transfer gas supplying device (not shown) is supplied into a gap between a top surface of the electrostatic chuck 18 and a rear surface of the semiconductor wafer W through a gas supply line 34.

The susceptor 16 is electrically connected with a first high frequency power supply 36 and a second high frequency power supply 38 via matching devices 40 and 42, respectively, and a common power supply conductor (for example, a power supply rod) 44. The first high frequency power supply 36 is configured to output a high frequency power RF1 having a frequency $f_1$ (for example, about 100 MHz) suitable for plasma generation. The second high frequency power supply 38 is configured to output a high frequency power RF2 having a frequency $f_2$ (for example, about 13.56 MHz) suitable for ion attraction to the semiconductor wafer W on the susceptor 16 from the plasma.

The matching devices 40 and 42 are configured to match load impedance on the side of plasma generated within the chamber 10 with impedance on the side of the high frequency power supplies 36 and 38, respectively, on high frequency power supply lines (high frequency transmission lines) 43 and 45. Each of the matching devices 40 and 42 includes a matching circuit including at least two controllable reactance elements, an actuator (for example, a motor) configured to control a reactance value (impedance position) of each of the reactance elements, a sensor configured to measure the load impedance including the matching circuit, and a controller configured to control an operation of each actuator such that a measurement value of the load impedance can be matched with a matching point (typically, about 50Ω).

This plasma processing apparatus employs a linear amplifier type high frequency power supply as the first high frequency power supply 36 for plasma generation, and a switching type high frequency power supply as the second high frequency power supply 38 for ion attraction. In this regard, a residual high frequency power removing unit 74 is connected to the high frequency power supply line 45 on a side of the second high frequency power supply 38. Configurations and operations of the high frequency power supplies 36 and 38 and the residual high frequency power removing unit 74 will be explained in detail later.

An upper electrode 46 having a ground potential is provided at a ceiling of the chamber 10, facing the susceptor 16 in parallel. The upper electrode 46 includes an electrode plate 48 having a multiple number of gas discharge holes 48a and made of, e.g., a silicon-containing material such as Si or SiC; and an electrode supporting body 50 detachably supporting the electrode plate 48 and made of a conductive material such as aluminum having an alumite-treated surface. A plasma generation space or a processing space PA is formed between the upper electrode 46 and the susceptor 16.

The electrode supporting body 50 has a gas buffer room 52 formed therein. The electrode supporting body 50 also has, in its bottom surface, a multiple number of gas holes 50a extended from the gas buffer room 52, and the gas holes 50a communicate with the gas discharge holes 48a of the electrode plate 48, respectively. The gas buffer room 52 is connected to a processing gas supply source 56 via a gas supply line 54. The gas supply line 54 is provided with a mass flow controller (MFC) 58 and an opening/closing valve 60. If a certain processing gas (etching gas) is introduced into the gas buffer room 52 from the processing gas supply source 56, the processing gas is then discharged in a shower shape from the gas discharge holes 48a of the electrode plate 48 into the processing space PA toward the semiconductor wafer W on the susceptor 16. In this configuration, the upper electrode 46 also serves as a shower head that supplies the processing gas into the processing space PA.

Further, a passageway (not shown) in which a coolant, e.g., cooling water flows may be provided within the electrode supporting body 50. The entire upper electrode 46, especially, the electrode plate 48 is controlled to a preset temperature through the coolant by an external chiller unit. Further, in order to stabilize the temperature control over the upper electrode 46, a heater (not shown) including a resistance heating device may be provided within or on a top surface of the electrode supporting body 50.

An annular space formed between a sidewall of the chamber 10, and the susceptor 16 and the susceptor supporting member 14 serves as a gas exhaust space, and a gas exhaust opening 62 of the chamber 10 is formed in a bottom of this gas exhaust space. The gas exhaust opening 62 is connected to a gas exhaust device 66 via a gas exhaust line 64. The gas exhaust device 66 includes a vacuum pump such as a turbo molecular pump and is configured to depressurize the inside of the chamber 10, particularly, the processing space PA to a required vacuum level. Further, a gate valve 70 configured to open and close a loading/unloading opening 68 for the semiconductor wafer W is provided at the sidewall of the chamber 10.

A main controller 72 includes one or more microcomputers and is configured to control an overall operation (sequence) of the apparatus and individual operations of respective components within the apparatus, particularly, the high frequency power supplies 36 and 38, the matching devices 40 and 42, the MFC 58, the opening/closing valve 60, the gas exhaust device 66, the residual high frequency power removing unit 74, etc., according to software (program) and recipes stored in an external memory or an internal memory.

Further, the main controller 72 is connected to a man-machine interface manipulation panel (not shown) including an input device such as a keyboard and a display device such as a liquid crystal display and, also, connected to an external storage device (not shown) that stores various types of data such as various programs or recipes, setting values, etc. In the present example embodiment, the main controller 72 is configured as a single control unit. However, it may be also possible to adopt a configuration in which multiple control units divide up the functions of the main controller 72 individually or hierarchically.

A basic operation of single-sheet typed dry etching in the capacitively coupled plasma etching apparatus configured as described above is performed as follows. First, the gate valve 70 is opened, and a semiconductor wafer W to be processed is loaded into the chamber 10 and mounted on the electrostatic chuck 18. Then, a processing gas, i.e., an etching gas (generally, a gaseous mixture) is introduced into the chamber 10 from the processing gas supply source 56 at a preset flow rate and a preset flow rate ratio, and the inside of the chamber 10 is evacuated to be a set vacuum pressure by the gas exhaust device 66. Further, the first high frequency power RF1 (about 100 MHz) from the first high frequency power supply 36 and the second high frequency power RF2 (about 13.56 MHz) from the high frequency power supply 38 are applied to the susceptor 16 while overlapped with each other (or either one alone). Further, a DC voltage from the DC power supply 24 is applied to the electrode 20 of the electrostatic chuck 18, so that the semiconductor wafer W is held on the electrostatic chuck 18. The etching gas discharged from the upper electrode 46 serving as the shower head is discharged under a high frequency electric field between the two electrodes 46 and 16, so that plasma is generated in the processing space PA. An etching target film on a main surface of the semiconductor wafer W is etched by radicals or ions included in the plasma.

<Circuit Configuration of First High Frequency Power Supply>

Figure 2:
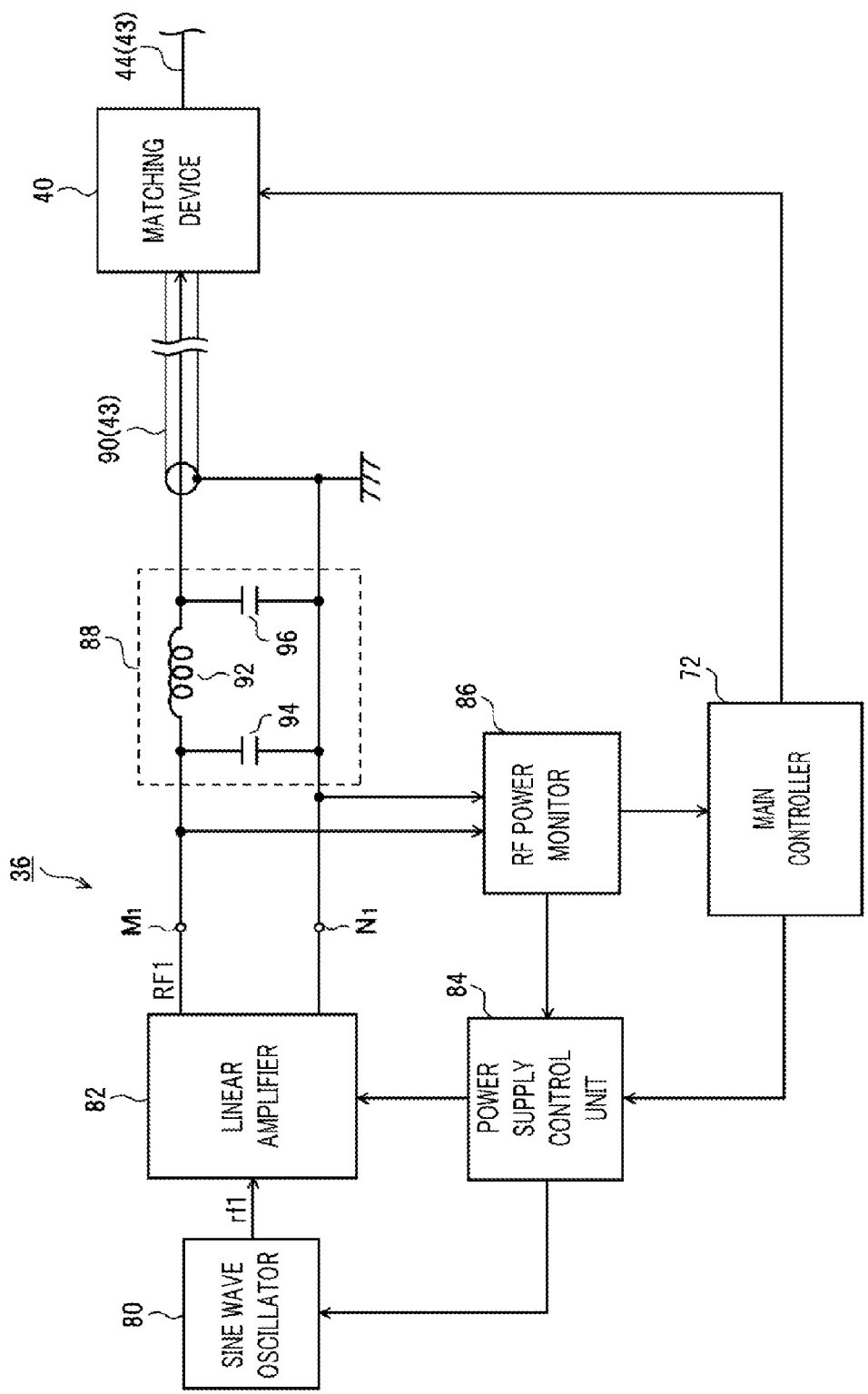
FIG. 2 is a diagram showing a circuit configuration of a first high frequency power supply in the plasma processing apparatus.

FIG. 2 shows a circuit configuration of the first high frequency power supply 36. The first high frequency power supply 36 is a linear amplifier type high frequency power supply as described above. The first high frequency power supply 36 includes a sine wave oscillator 80 configured to generate a sine wave signal rf1 having a first high frequency $f_1$ (about 100 MHz); a linear amplifier 82 configured to output a first high frequency power RF1 by controlling a gain or an amplification factor thereof while maintaining the sine waveform of the sine wave signal rf1 outputted from the oscillator 80; and a power supply control unit 84 configured to directly control the oscillator 80 and the linear amplifier 82 in response to a control signal from the main controller 72. In this plasma etching apparatus, when a pulse modulation is performed on the first high frequency power RF1, the main controller 72 and the power supply control unit 84 serve as a power modulation unit.

Within the first high frequency power supply 36, a RF power monitor 86 is also included. This RF power monitor 86 includes a directional coupler, a progressive wave power monitoring unit, and a reflection wave power monitoring unit although illustration thereof is omitted. Herein, the directional coupler is configured to acquire signals respectively corresponding to a RF power (progressive wave power) that propagates on the high frequency power supply line 43 in a forward direction and a RF power (reflection wave power) that propagates on the high frequency power supply line 43 in a backward direction. The progressive wave power monitoring unit is configured to generate a signal for a fundamental frequency progressive wave power (about 100 MHz) included in the progressive wave on the high frequency transmission line 43 based on a progressive wave power detection signal acquired by the directional coupler. This signal, i.e., a signal for a fundamental frequency progressive wave power measurement value, is sent to the power supply control unit 84 within the first high frequency power supply 36 for power feedback control, and also sent to the main controller 72 for monitor display. The reflection wave power monitoring unit is configured to measure a fundamental frequency reflection wave power (about 100 MHz) included in the reflection wave returning from the plasma within the chamber 10 back to the first high frequency power supply 36, and also measure a total power from spectra of all reflection waves included in the reflection wave returning from the plasma within the chamber 10 back to the first high frequency power supply 36. A fundamental frequency reflection wave power measurement value obtained by the reflection wave power monitoring unit is sent to the main controller 72 for monitor display, and a total reflection wave power measurement value is sent to the power supply control unit 84 within the first high frequency power supply 36 as a monitor value for power amplifier protection.

The linear amplifier 82 includes output terminals $M_1$ and $N_1$ which are connected to input terminals of the matching device 40 via a low pass filter 88 and a coaxial cable 90. The low pass filter 88 is configured to remove a frequency component (distortion component) higher than the first frequency $f_1$ in the first high frequency power RF1 from the linear amplifier 82. The illustrated low pass filter 88 is of a π-type circuit that includes one coil 92 interposed in series on the high frequency power supply line 43, and two capacitors 94 and 96 interposed in parallel on both sides of the coil 92.

Figure 3:
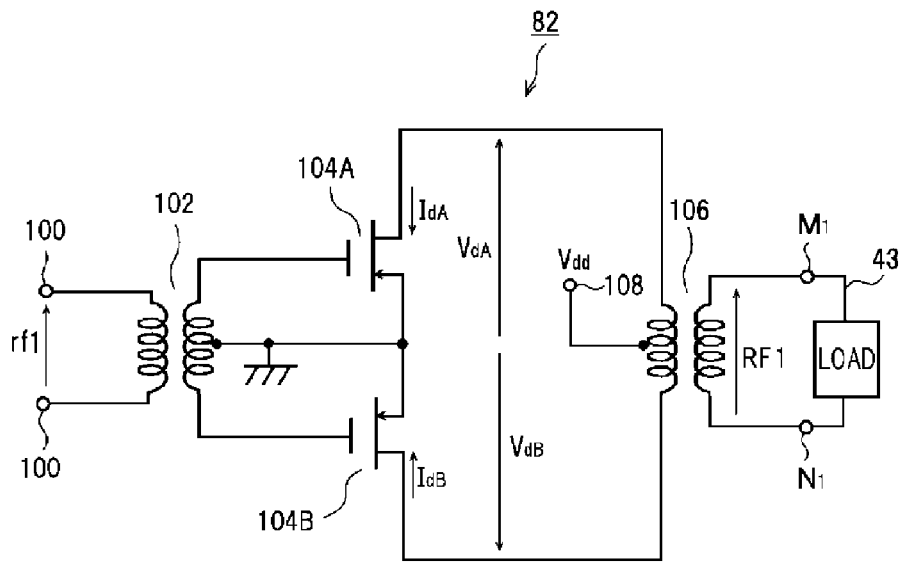
FIG. 3 is a circuit diagram showing a circuit configuration of a linear amplifier included in the first high frequency power supply.

FIG. 3 shows a circuit configuration of the linear amplifier 82. This linear amplifier 82 includes an input transformer 102 in which the sine wave signal rf1 from the oscillator 80 is inputted to a primary coil thereof via an input terminal 100; a pair of amplifying transistors, for example, P-type MOSFETs 104A and 104B, of which control terminals are respectively connected to both ends of a secondary coil of the input transformer 102; and an output transformer 106 in which a secondary coil thereof is connected to a load.

One terminal of the secondary coil of the input transformer 102 is connected to a gate terminal of the first MOSFET 104A, and the other terminal thereof is connected to a gate terminal of the second MOSFET 104B, and a middle point thereof is grounded. A source terminal of the first MOSFET 104A is grounded, and a drain terminal thereof is connected to one terminal of a primary coil of the output transformer 106. A source terminal of the second MOSFET 104B is grounded, and a drain terminal thereof is connected to the other terminal of the primary coil of the output transformer 106. A middle point of the primary coil of the output transformer 106 is connected to a terminal 108 of a power supply voltage $V_{dd}$ of a variable DC power supply (not illustrated), and the secondary coil thereof is connected to a load on the high frequency power supply line 43 via the output terminals $M_1$ and $N_1$. The load mainly includes the plasma within the chamber 10 and a matching circuit within the matching device 40.

In this linear amplifier 82, during a positive half cycle of the sine wave signal rf1, the first MOSFET 104A is off and the second MOSFET 104B is controlled to be on. As a result, an electric current $I_{dB}$ having a waveform corresponding to the sine wave signal rf1 flows from the terminal 108 of the DC power supply voltage $V_{dd}$ to a ground (ground potential member) via the output transformer 106 and the second MOSFET 104B. In this case, in a load circuit on the secondary coil side of the output transformer 106, an electric current of the first high frequency power RF1 flows in a negative direction. During a negative half cycle of the sine wave signal rf1, the second MOSFET 104B is off and the first MOSFET 104A is controlled to be on. As a result, an electric current $I_{dA}$ having the waveform corresponding to the sine wave signal rf1 flows from the terminal 108 of the DC power supply voltage $V_{dd}$ to the ground (ground potential member) via the output transformer 106 and the first MOSFET 104A. In this case, in the load circuit on the secondary coil side of the output transformer 106, the electric current of the first high frequency power RF1 flows in a positive direction.

The first high frequency power RF1 outputted from the secondary coil of the output transformer 106 has a sine waveform similar to the sine wave signal rf1 inputted to the primary coil of the input transformer 102. By controlling the DC power supply voltage $V_{dd}$, the amplification factor can be varied and the first high frequency power RF1 can be adjusted in a range of a frequency of about 100 MHz or more.

Herein, assuming that an output of the DC power supply, i.e. a DC power, is $P_{DC}$, an output of the high frequency power supply, i.e. a RF power, is $P_{RE}$, and a power consumed within the high frequency power supply is $P_C$, $P_{DC}=P_{RF}+P_C$, and a DC-RF conversion efficiency is $(P_{RF}/P_{DC}) \times 100\%$. The DC-RF conversion efficiency is one of indicators that determine a utility value of the high frequency power supply.

The linear amplifier type high frequency power supply 36 has a wide range of an operation frequency as such, and when the first high frequency power RF1 is turned on/off by the power modulation, the sine wave oscillator 80 of the low power may be controlled to be on/off under the control of the power supply control unit 84. For this reason, during each cycle of a pulse frequency, when the high frequency power supply 36 is switched from an on state to an off state, the sine wave oscillator 80 is immediately turned off. Thus, the first high frequency power RF1 is immediately removed on the high frequency power supply line 43, and the RF power trailing phenomenon does not occur. However, the power (loss) $P_C$ consumed within the linear amplifier 82 becomes larger, so that the DC-RF conversion efficiency may not be high.

Figure 4:
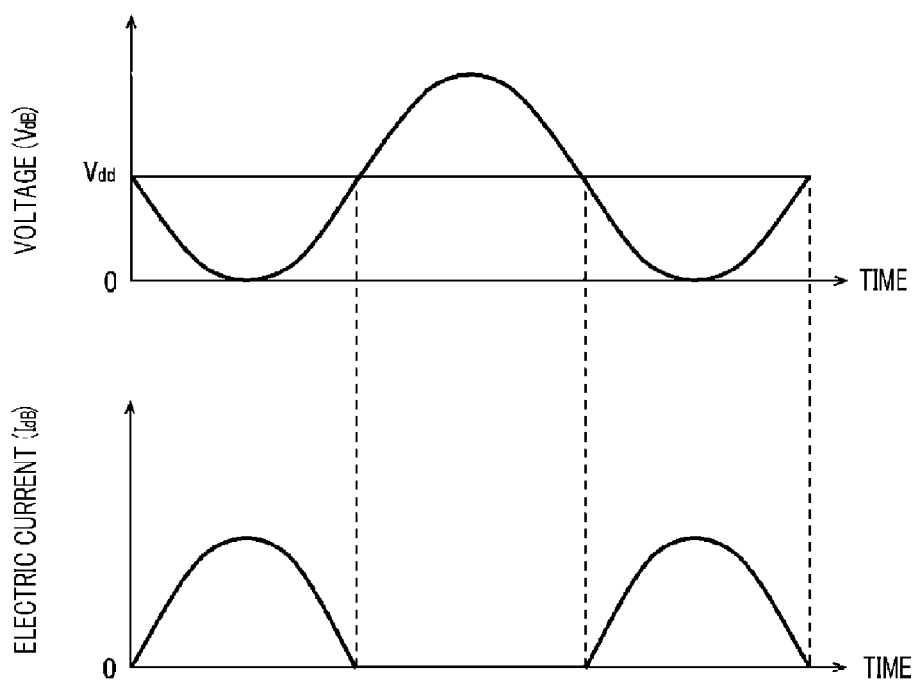
FIG. 4 is a diagram showing waveforms of a voltage and an electric current in a MOSFET constituting the linear amplifier.

FIG. 4 shows waveforms of a source-drain voltage $V_{dB}$ and a drain electric current $I_{dB}$ in the second MOSFET 104B. As can be seen from this drawing, in the MOSFET 104B, an effective power $(V_{dB}*I_{dB})$ is present and consumed as a drain loss. Although illustration is omitted, waveforms of a source-drain voltage $V_{dA}$ and a drain electric current $I_{dA}$ in the first MOSFET 104A become opposite in phase to the waveforms of $V_{dB}$ and $I_{dB}$, respectively. In the first MOSFET 104A, an effective power $(V_{dA}*I_{dA})$ is present and consumed as a drain loss.

<Circuit Configuration of Second High Frequency Power Supply and Residual High Frequency Power Removing Unit>

Figure 5:
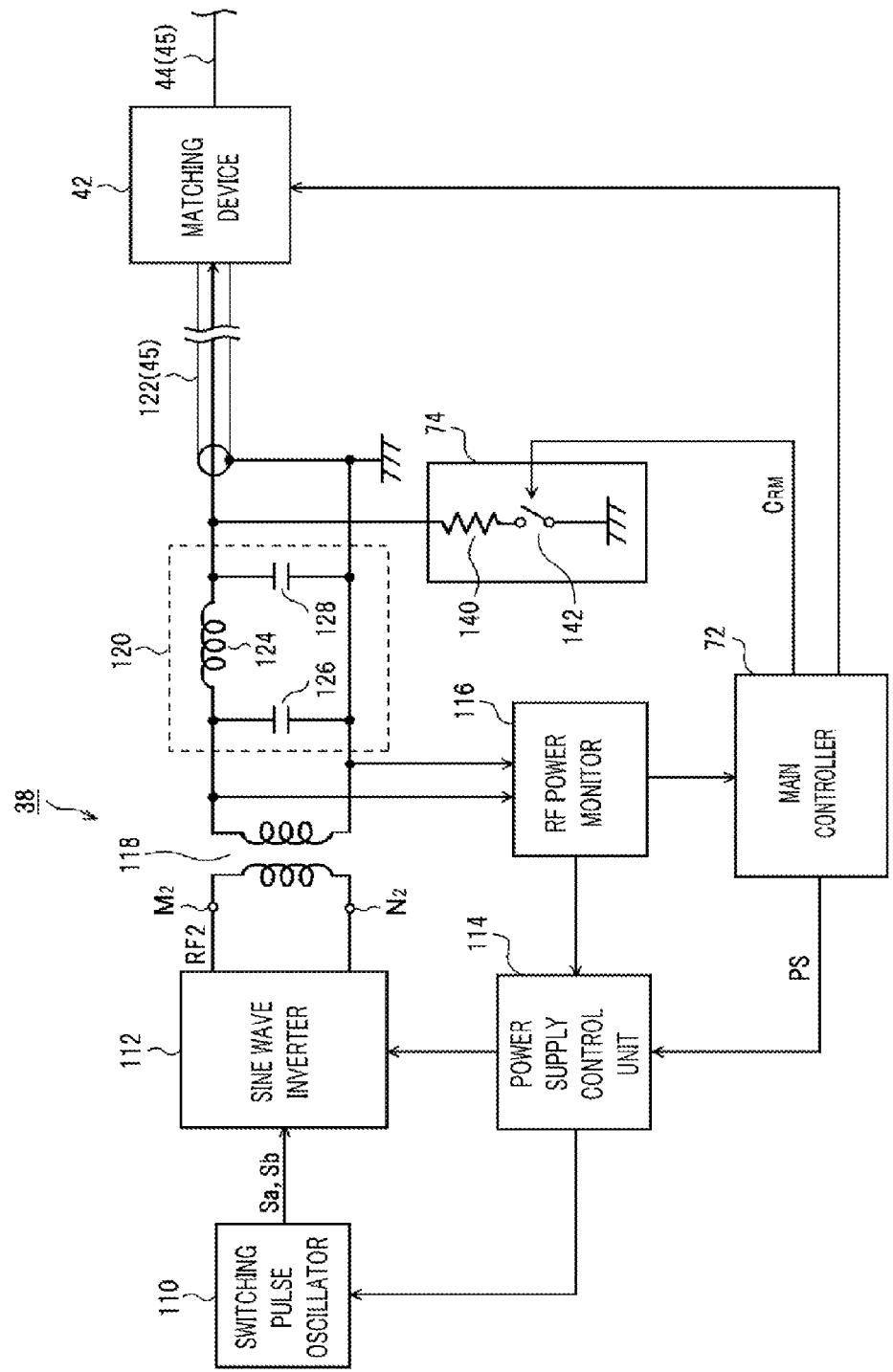
FIG. 5 is a diagram showing a circuit configuration of a second high frequency power supply in the plasma processing apparatus.

FIG. 5 shows a circuit configuration of the second high frequency power supply 38 and the residual high frequency power removing unit 74. The second high frequency power supply 38 is a switching type high frequency power supply as described above. The second high frequency power supply 38 includes a switching pulse oscillator 110 configured to generate dual phase switching pulses $S_a$ and $S_b$ having the second high frequency $f_2$ (about 13.56 MHz); a sine wave inverter 112 configured to convert an output of the DC power supply into the second high frequency power RF2 of a sine wave in response to the dual phase switching pulses $S_a$ and $S_b$, which will be described below, from the oscillator 110; and a power supply control unit 114 configured to directly control the oscillator 110 and the sine wave inverter 112 in response to a control signal from the main controller 72. In this plasma etching apparatus, when the pulse modulation is performed on the second high frequency power RF2, the main controller 72 and the power supply control unit 114 serve as a power modulation unit.

Within the second high frequency power supply 38, a RF power monitor 116 is also included. This RF power monitor 116 includes a directional coupler, a progressive wave power monitoring unit, and a reflection wave power monitoring unit although illustration thereof is omitted. Herein, the directional coupler is configured to acquire signals respectively corresponding to a RF power (progressive wave power) that propagates on the high frequency power supply line 45 in a forward direction and a RF power (reflection wave power) that propagates on the high frequency power supply line 45 in a backward direction. The progressive wave power monitoring unit is configured to generate a signal for a fundamental frequency progressive wave power (about 13.56 MHz) included in the progressive wave on the high frequency transmission line 45 based on a progressive wave power detection signal acquired by the directional coupler. This signal, i.e., a signal for a fundamental frequency progressive wave power measurement value, is sent to the power supply control unit 114 within the second high frequency power supply 38 for power feedback control, and also sent to the main controller 72 for monitor display. The reflection wave power monitoring unit is configured to measure a fundamental frequency reflection wave power (about 13.56 MHz) included in the reflection wave returning from the plasma within the chamber 10 back to the second high frequency power supply 38, and also measures a total power from spectra of all reflection waves included in the reflection wave returning from the plasma within the chamber 10 back to the second high frequency power supply 38. A fundamental frequency reflection wave power measurement value obtained by the reflection wave power monitoring unit is sent to the main controller 72 for monitor display and a total reflection wave power measurement value is sent to the power supply control unit 114 within the second high frequency power supply 38 as a monitor value for power amplifier protection.

The sine wave inverter 112 includes output terminals $M_2$ and $N_2$ which are connected to input terminals of the matching device 42 via a transformer 118, a low pass filter 120, and a coaxial cable 122. The transformer 118 is used in the impedance conversion. The low pass filter 120 is configured to remove a frequency component (distortion component) higher than the second frequency $f_2$ in the second high frequency power RF2 from the sine wave inverter 112. The illustrated low pass filter 120 is of a $\pi$-type circuit that includes one coil 124 interposed in series on the high frequency power supply line 45, and two capacitors 126 and 128 interposed in parallel on both sides of the coil 124.

Figure 6:
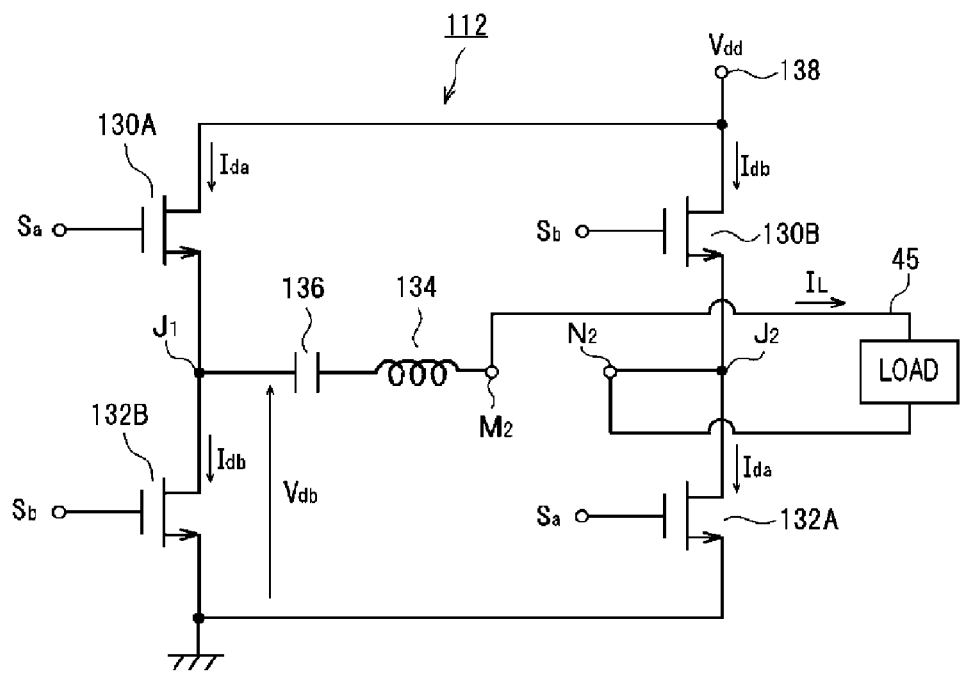
FIG. 6 is a circuit diagram showing a circuit configuration of a sine wave inverter included in the second high frequency power supply.

FIG. 6 shows a circuit configuration of the sine wave inverter 112. This sine wave inverter 112 includes switching devices, for example, N-type MOSFETs 130A and 132A of a first group; switching devices, for example, N-type MOSFETs 130B and 132B of a second group, which are configured as a full bridge circuit; and a coil 134 and a capacitor 136 connected in series with the MOSFETs 130A and 132A of the first group or the MOSFETs 130B and 132B of the second group with respect to the load.

To be more specific, a drain terminal of one MOSFET 130A of the first group is connected to a terminal 138 of a DC power supply voltage $V_{dd}$ and a source terminal thereof is connected to a node $J_1$, and a first-phase switching pulse $S_a$ is inputted to a gate terminal thereof. A drain terminal of one MOSFET 130B of the second group is connected to the terminal 138 of the DC power supply voltage $V_{dd}$ and a source terminal thereof is connected to a node $J_2$, and a second-phase switching pulse $S_b$ is inputted to a gate terminal thereof. A drain terminal of the other MOSFET 132A of the first group is connected to the node $J_2$ and a source terminal thereof is grounded, and the first-phase switching pulse $S_a$ is inputted to a gate terminal thereof. A drain terminal of the other MOSFET 132B of the second group is connected to the node $J_1$ and a source terminal thereof is grounded, and the second-phase switching pulse $S_b$ is inputted to a gate terminal thereof. Between the node $J_1$ and the node $J_2$, the capacitor 136, the coil 134, one output terminal $M_2$, a load, and the other output terminal $N_2$ are connected in series. The coil 134 and the capacitor 136 form a series resonance circuit with respect to the second high frequency power RF2. The load mainly includes the plasma within the chamber 10 and a matching circuit within the matching device 42.

In this sine wave inverter 112, if the MOSFETs 130B and 132B of the second group are maintained in an off state and the MOSFETs 130A and 132A of the first group are turned on by the first-phase switching pulse $S_a$, a load electric current (an electric current of the second high frequency power RF2) $I_L$ flows from the terminal 138 of the DC power supply voltage $V_{dd}$ to a ground (ground potential member) via the MOSFET 130A, the capacitor 136, the coil 134, the output terminal $M_2$, the load, the output terminal $N_2$, and the MOSFET 132A in a positive direction. On the contrary, if the MOSFETs 130A and 132A of the first group are maintained in an off state and the MOSFETs 130B and 132B of the second group are turned on by the second-phase switching pulse $S_b$, the load electric current (an electric current of the second high frequency power RF2) $I_L$ flows from the terminal 138 of the DC power supply voltage $V_{dd}$ to the ground (ground potential member) via the MOSFET 130B, the output terminal $N_2$, the load, the output terminal $M_2$, the coil 134, the capacitor 136, and the MOSFET 132B in a negative direction.

Figure 7:
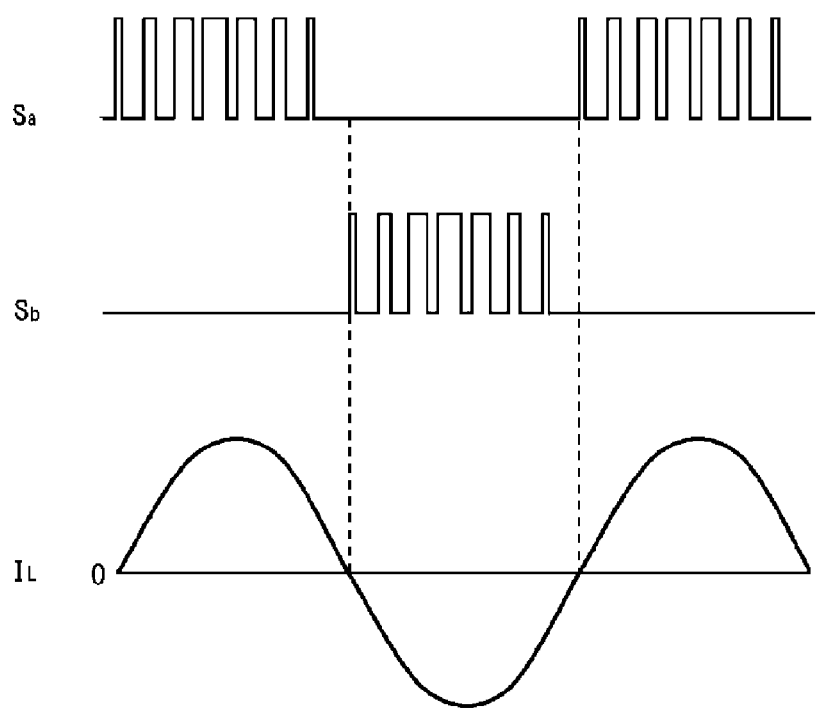
FIG. 7 provides waveform diagrams of respective components showing an operation for generating a second high frequency power in a sine wave by a PWM method in the sine wave inverter.

In this sine wave inverter 112, as depicted in FIG. 7, the dual phase switching pulses $S_a$ and $S_b$ generated by the oscillator 110 have a pulse waveform of a PWM (pulse width modulation) under the control of the power supply control unit 114. As a result, it is possible to allow the load electric current (electric current of the first high frequency power RF1) $I_L$ to be in a sine wave. Since the on-period or a duty ratio of the switching pulses $S_a$ and $S_b$ can be varied, the second high frequency power RF2 can be controlled.

Contrary to the linear amplifier type high frequency power supply, the switching type high frequency power supply 38 as described above has an operation frequency determined by the rate controls of the switching devices 130A, 130B, 132A, and 132B, and power loss is very small, so that the DC-RF conversion efficiency is high.

Figure 8:
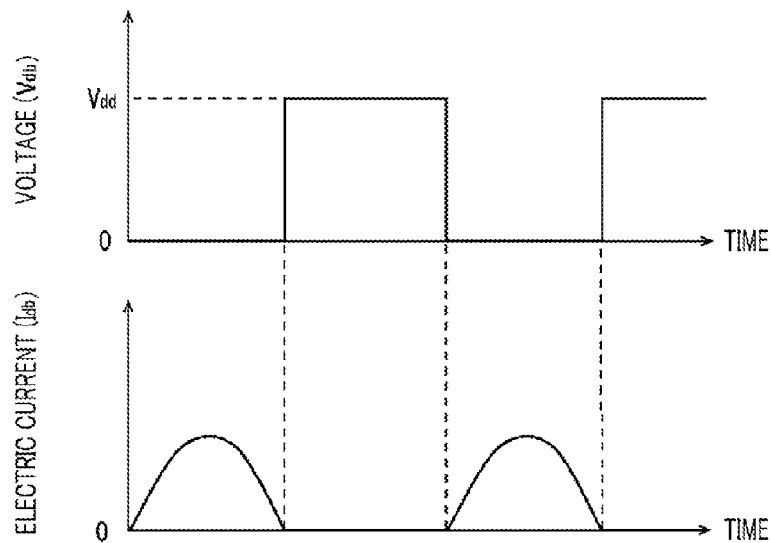
FIG. 8 provides diagrams showing waveforms of respective components when the power modulation is performed on the second high frequency power in the plasma processing apparatus.

FIG. 8 shows waveforms of a source-drain voltage $V_{db}$ and a drain electric current $I_{db}$ in the other MOSFET 132B of the second group. During a first half cycle where an electric current $I_L$ of the second high frequency power RF2 flows through the load circuit in a negative direction, the source and the drain of the MOSFET 132B are electrically connected (short-circuited) in a saturation state and a drain electric current $I_{db}$ flows. During a second half cycle where the electric current $I_L$ of the second high frequency power RF2 flows through the load circuit in a positive direction, the MOSFET 132B is in an off state and the drain electric current $I_{db}$ does not flow. Therefore, in most cases, there is no effective power ($V_{db} * I_{db}$) or drain loss. The same results can be obtained from the other MOSFETs 130A, 132A, and 130B.

Meanwhile, in the second high frequency power supply 38 of a switching type, when an output of the second high frequency power RF2 is stopped, energy of the second high frequency power RF2 may remain in the sine wave inverter 112 or the low pass filter 120 and this tends to cause the RF power trailing phenomenon. In particular, if LC series resonance circuits 134 and 136 are included, such a tendency becomes strong. In this example embodiment, since the residual high frequency power removing unit 74 is connected to the high frequency power supply line 45, it is possible to avoid or reduce occurrence of the RF power trailing phenomenon in the second high frequency power supply 38.

Returning to FIG. 5 again, the residual high frequency power removing unit 74 is provided between the low pass filter 120 and the coaxial cable 122 on the high frequency power supply line 45. Otherwise, the residual high frequency power removing unit 74 may be provided on the side of the primary coil of the transformer 118, and it may be provided at any position on the high frequency power supply line 45 as long as it is positioned between the sine wave inverter 112 and the matching device 42.

The residual high frequency power removing unit 74 includes a resistance 140 and a switch 142 connected in series between the high frequency power supply line 45 and the ground (ground potential member). This switch 142 is formed of, for example, a MOS transistor, and if the power modulation is performed on the second high frequency power RF2, the switch 142 is operated in response to a residual high frequency power removing signal $C_{RM}$ from the main controller 72. If the $C_{RM}$ is at a H-level, the switch is turned on, and if the $C_{RM}$ is at a L-level, the switch is turned off. If the power modulation is not performed on the second high frequency power RF2, a residual high frequency power removing signal $C_{RM}$ is not outputted from the main controller 72, and the switch 142 is maintained in the off state. The residual high frequency power removing signal $C_{RM}$ is outputted as a control pulse in synchronization with a modulation control pulse signal PS that determines a pulse frequency and a duty ratio for the pulse modulation, as described below.

<Operation of Residual High Frequency Power Removing Unit>

Figure 9:
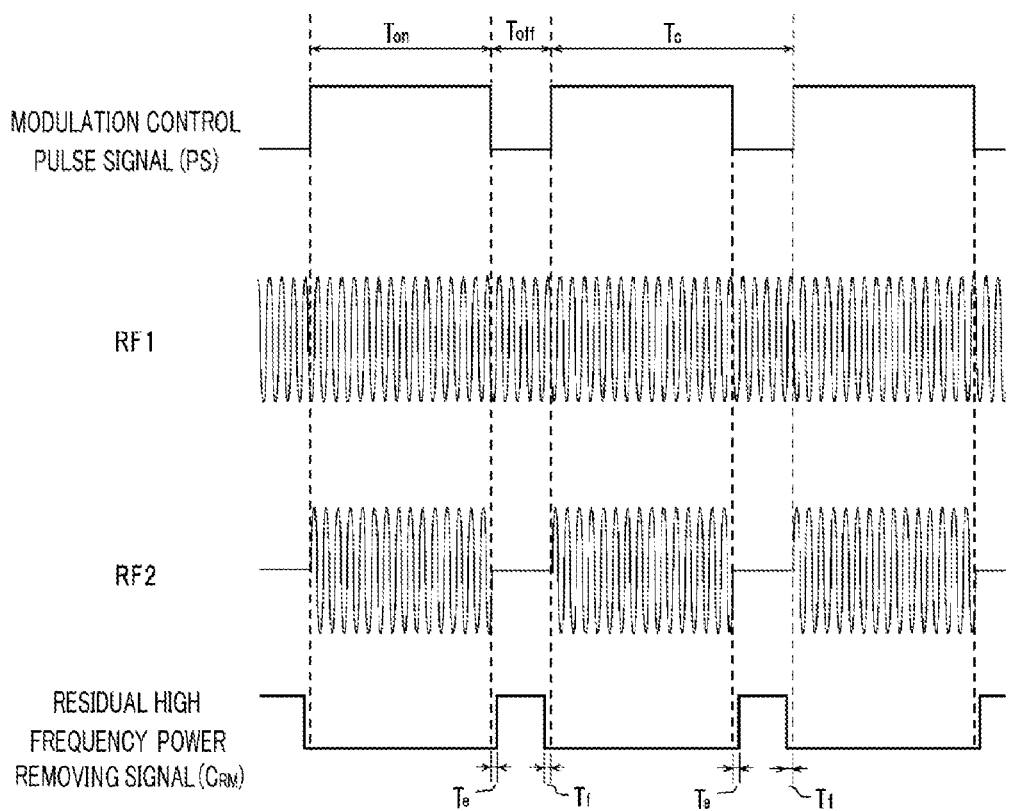
FIG. 9 provides waveform diagrams of respective components for describing an operation of the example embodiment.

Hereinafter, an operation of the residual high frequency power removing unit 74 of the present example embodiment will be explained. FIG. 9 shows waveforms of respective main components when the pulse modulation is performed on the second high frequency power RF2 in this capacitively coupled plasma etching apparatus.

In this case, the main controller 72 outputs the modulation control pulse signal PS that determines a pulse frequency $f_s$ and a duty ratio $D_s$ for the power modulation to the power supply control unit 114 of the second high frequency power supply 38. The power supply control unit 114 turns on/off the switching pulse oscillator 110, and also turns on/off an output of the second high frequency power RF2 in synchronization with the modulation control pulse signal PS. Herein, assuming that a cycle, an on-period time, and an off-period time of the modulation control pulse signal PS are $T_c$, $T_{on}$, and $T_{off}$, respectively, the relational equations $T_c = 1/f_s$, $T_c = T_{on} + T_{off}$, and $D_s = T_{on}/(T_{on} + T_{off})$ are established. Meanwhile, the first high frequency power supply 36 continuously outputs the first high frequency power RF1 without being turned on/off.

Further, the main controller 72 outputs the residual high frequency power removing signal $C_{RM}$ to the switch 142 of the residual high frequency power removing unit 74. As shown in FIG. 9, the residual high frequency power removing signal $C_{RM}$ is synchronized in antiphase with the modulation control pulse signal PS, and during the on-period time $T_{on}$ in each cycle of a pulse frequency, the residual high frequency power removing signal $C_{RM}$ is maintained at a L-level, and during the off-period time $T_{off}$ (desirably, excluding transition times $T_e$ and $T_f$ immediately after starting the off-period time $T_{off}$ and immediately before ending the off-period time $T_{off}$), the residual high frequency power removing signal $C_{RM}$ is at a H-level. Thus, the switch 142 is maintained in an off state during the on-period time $T_{on}$ and in an on state during the off-period time $T_{off}$ in each cycle of the pulse frequency.

When the switch 142 is turned on, the second high frequency power RF2 remaining on the high frequency power supply line 45 (more specifically, all progressive waves and reflection waves on the high frequency power supply line 45) flows to the ground (ground potential member) through the resistance 140 and the switch 142. The resistance 140 limits the electric current of the second high frequency power RF2 flowing from the high frequency power supply line 45 to the ground and generates Joule heat, so that the remaining RF power is consumed.

Thus, when the on-period time $T_{on}$ is ended and the off-period time $T_{off}$ is started in each cycle of the pulse frequency, the second high frequency power RF2 accumulated as electron energy or electric charge energy in the coils 124 and 134 or the capacitors 126, 128, and 136 within the sine wave inverter 112 or the low pass filter 120 (more specifically, all progressive waves and reflection waves on the high frequency power supply line 45) are rapidly removed from the high frequency power supply line 45.

Figure 10:
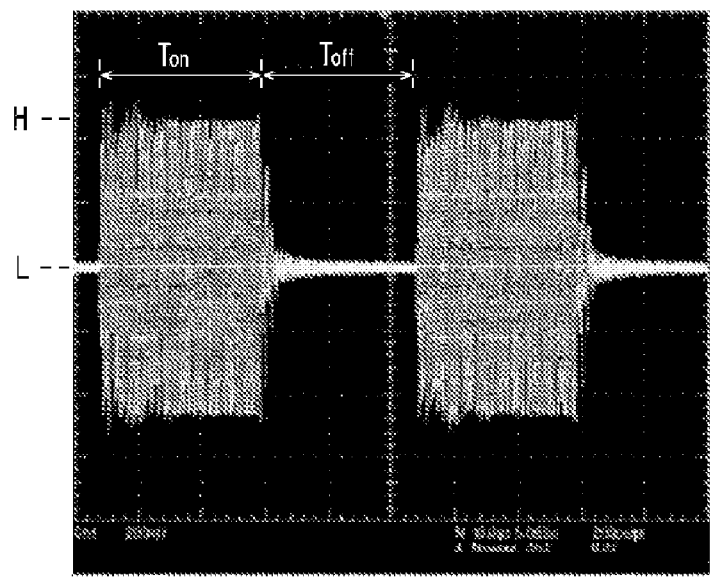
FIG. 10 is a waveform diagram of a high frequency power on a high frequency power supply line observed in an experimental example in which a residual high frequency power removing unit is included in accordance with the example embodiment.

The present inventors have performed the power modulation of a pulse frequency $f_s$ of about 20 kHz and a duty ratio of about 50% with an output of, for example, about 500 W on the second high frequency power RF2 in the plasma etching apparatus of the present example embodiment and observed a waveform of the high frequency power on the high frequency power supply line 45 with an oscilloscope. As shown in FIG. 10, when the on-period time $T_{on}$ (ON-period time in the drawing) is ended and the off-period time $T_{off}$ (OFF-period time in the drawing) is started in each cycle of the pulse frequency, the second high frequency power RF2 is decreased from a H-level (about 500 W) to a L-level (about 0 W) in a step shape. Thus, it can be seen that the RF power trailing phenomenon does not occur.

Figure 11:
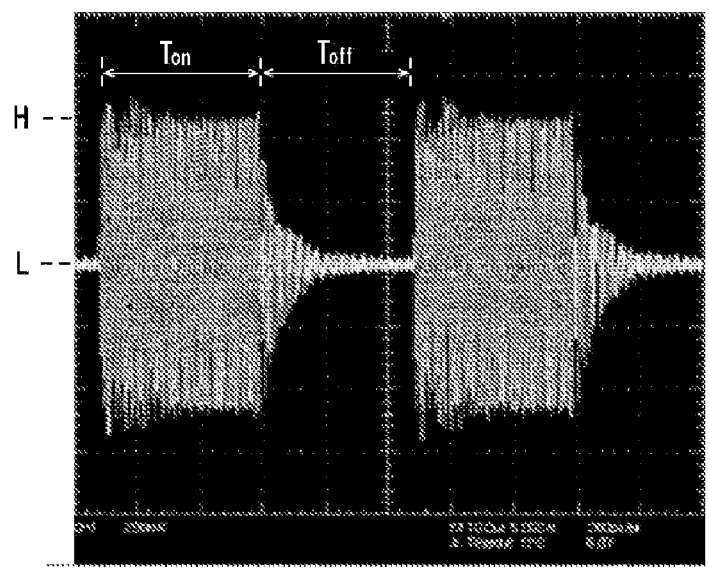
FIG. 11 is a waveform diagram of a high frequency power in a high frequency power supply line observed in a comparative example in which the residual high frequency power removing unit is not provided.

Meanwhile, without providing the residual high frequency power removing unit 74, the power modulation is performed on the second high frequency power RF2 under the same conditions as described above, and then, a waveform of the high frequency power on the high frequency power supply line 45 is observed with an oscilloscope. As shown in FIG. 11, when the on-period time $T_{on}$ (ON-period time in the drawing) is ended and the off-period time $T_{off}$ (OFF-period time in the drawing) is started in each cycle of the pulse frequency, it can be seen that an amplitude of the second high frequency power RF2 is gradually decreased during a certain time period to be a L-level (about 0 W), i.e., the RF power trailing phenomenon occurs.

As such, in the present example embodiment, it is possible to simply and securely suppress the RF power trailing phenomenon from occurring on the high frequency power supply line when the power modulation is performed on the second high frequency power RF2. Thus, it is possible to supply the high frequency power in a rectangular wave pulse pattern. Further, the RF power trailing phenomenon may not occur on the high frequency power supply line 45, and accuracy of monitoring information acquired by the RF power monitor 116 can be improved.

Figure 12:
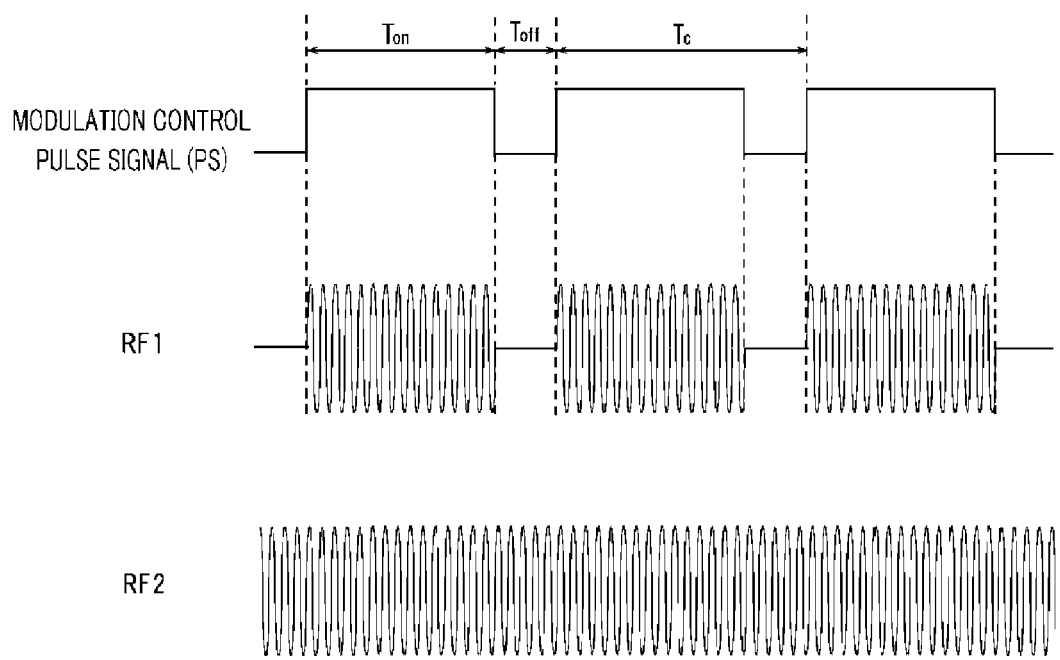
FIG. 12 is a diagram showing waveforms of respective components when the power modulation is performed on the first high frequency power in the plasma processing apparatus.

Further, in the plasma etching apparatus of the present example embodiment, as shown in FIG. 12, it is possible to perform the power modulation on the first high frequency power RF1. In this case, the main controller 72 outputs a modulation control pulse signal PS that determines a pulse frequency $f_s$ and a duty ratio $D_s$ for the power modulation to the power supply control unit 84 of the second high frequency power supply 36. The power supply control unit 84 turns on/off the sine wave oscillator 80, and also turns on/off an output of the first high frequency power RF1 in synchronization with the modulation control pulse signal PS. Meanwhile, the second high frequency power supply 38 continuously outputs the second high frequency power RF2 without being turned on/off. The residual high frequency power removing signal $C_{RM}$ from the main controller 72 is not inputted to the switch 142 of the residual high frequency power removing unit 74, so that the switch 142 is maintained in an off state.

As described above, since the first high frequency power supply 36 is configured as a linear amplifier type high frequency power supply, if the power modulation is performed on the first high frequency power RF1, when the on-period time $T_{on}$ is ended and the off-period time $T_{off}$ is started in each cycle of the pulse frequency, the first high frequency power RF1 may not remain on the high frequency power supply line 43, so that the RF power trailing phenomenon may not occur.

Another Example Embodiment or Modification Example

The example embodiment has been explained, but is not limited thereto, and can be modified in various ways within a technical scope thereof.

In the above example embodiment, the switching type high frequency power supply is used as the second high frequency power supply 38, and the residual high frequency power removing unit 74 is provided on the high frequency power supply line 45. However, the switching type high frequency power supply may be used as the first high frequency power supply 36, and in this case, another residual high frequency power removing unit 74 may be provided on the high frequency power supply line 43.

Further, the switching type high frequency power supply may be used as both of the first high frequency power supply 36 and the second high frequency power supply 38. In this case, the residual high frequency power removing unit 74 may be provided on each of the high frequency power supply line 43 and the high frequency power supply line 45.

Furthermore, as shown in FIG. 13, the power modulation may be performed on both of the first high frequency power RF1 and the second high frequency power RF2. In this case, the main controller 72 outputs the modulation control pulse signal PS that determines the pulse frequency $f_s$ and the duty ratio $D_s$ for the power modulation to the power supply control unit 84 of the first high frequency power supply 36 and the power supply control unit 114 of the second high frequency power supply 38.

The switching type high frequency power supply in the plasma processing apparatus of the example embodiments is not limited to be configured as a full-bridge type using two pairs (four) of the switching devices as described in the above example embodiment, and may be, for example, a half-bridge type using a pair (two) of the switching devices. In this case, by single or dual phase switching pulse, in each cycle of the pulse frequency, a switching control is carried out as follows. That is, while a first switching device is maintained in an off state, a second switching device is in an on state during the former half cycle, and while the second switching device is maintained in an off state, the first switching device is in an on state during the latter half cycle.

Further, the high frequency power RF1 of the first high frequency power supply 36 suitable for plasma generation is applied to the susceptor (lower electrode) 16 in the above example embodiment, but can also be applied to the upper electrode 46.

The example embodiments are not limited to a capacitively coupled plasma etching apparatus and can be applied to a capacitively coupled plasma processing apparatus configured to perform a certain plasma process such as plasma CVD, plasma ALD, plasma oxidation, plasma nitrification, sputtering, and the like. A processing target substrate of the example embodiments is not limited to a semiconductor wafer, and can be any one of various substrates for a flat panel display, an organic EL, a solar cell, or a photo mask, a CD substrate, and a printed circuit board.

EXPLANATION OF REFERENCE NUMERALS

10: Chamber
16: Susceptor (Lower electrode)
36, 38: High frequency power supplies
40, 42: Matching devices
43, 45: High frequency power supply lines
46: Upper electrode (Shower head)
56: Processing gas supply source
72: Main controller
74: Residual high frequency power removing unit

We claim:

1. A plasma processing apparatus of generating plasma of a processing gas in an evacuable processing chamber that accommodates a substrate to be processed, which is loaded thereinto and unloaded therefrom, and performing a process on the substrate under the plasma, the plasma processing apparatus comprising:
a switching type high frequency power supply, having a DC power supply and a switching device, configured to convert a DC power outputted from the DC power supply into a high frequency power by turning on/off the switching device with a switching pulse at a high frequency;
a high frequency power supply line through which the high frequency power outputted from the high frequency power supply is applied to the plasma;
a matching device configured to match impedance on a side of the high frequency power supply with load impedance on the high frequency power supply line;
a high frequency power modulation unit that controls the high frequency power supply to alternately repeat an on-period time where the high frequency power is in an on state and an off-period time where the high frequency power is in an off state at a preset pulse frequency; and
a residual high frequency power removing unit configured to remove the high frequency power remaining on the high frequency power supply line during the off-period time in each cycle of the pulse frequency,
wherein the residual high frequency power removing unit is provided on the high frequency power supply line between the switching device and the matching device.

2. The plasma processing apparatus of claim 1,
wherein the high frequency power supply includes switching devices of a first group and switching devices of a second group constituting a full-bridge circuit,
in each cycle of the high frequency power with the switching pulse, while the switching devices of the second group are maintained in an off state, the switching devices of the first group are in an on state during a former half cycle, and
while the switching devices of the first group are maintained in an off state, the switching devices of the second group are in an on state during a latter half cycle.

3. The plasma processing apparatus of claim 1,
wherein the high frequency power supply includes a first switching device and a second switching device constituting a half-bridge circuit,
in each cycle of the high frequency power with the switching pulse, while the second switching device is maintained in an off state, the first switching device is in an on state during a former half cycle, and
while the first switching device is maintained in an off state, the second switching device is in an on state during a latter half cycle.

4. The plasma processing apparatus of claim 1,
wherein the high frequency power supply is configured to continuously supply the switching pulse to the switching device during the on-period time and stop the supply of the switching pulse to the switching device during the off-period time in each cycle of the pulse frequency.

5. The plasma processing apparatus of claim 1,
wherein the high frequency power supply includes a series resonance circuit connected in series with the switching device with respect to a load circuit.

6. The plasma processing apparatus of claim 1,
wherein the residual high frequency power removing unit includes a resistance and a switch connected in series between the high frequency power supply line and a ground potential member, and is configured to maintain the switch in an off state during the on-period time and maintain the switch in an on state during the off-period time in each cycle of the pulse frequency.

7. The plasma processing apparatus of claim 1,
wherein a high frequency electrode configured to mount thereon the substrate is provided within the processing chamber, and the high frequency power supply line is electrically connected to the high frequency electrode.

* * * * *